(12) United States Patent
Fan et al.

(10) Patent No.: US 9,024,389 B2
(45) Date of Patent: May 5, 2015

(54) BORDERLESS CONTACT FOR ULTRA-THIN BODY DEVICES

(71) Applicant: International Business Machines Corporation, Armonk, NY (US)

(72) Inventors: Su Chen Fan, Cohoes, NY (US); Balasubramanian S. Haran, Watervliet, NY (US); David V. Horak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 134 days.

(21) Appl. No.: 13/732,806

(22) Filed: Jan. 2, 2013

(65) Prior Publication Data
US 2013/0134517 A1 May 30, 2013

Related U.S. Application Data

(62) Division of application No. 13/191,540, filed on Jul. 27, 2011, now Pat. No. 8,383,490.

(51) Int. Cl.
| | |
|---|---|
| *H01L 29/76* | (2006.01) |
| *H01L 29/94* | (2006.01) |
| *H01L 29/786* | (2006.01) |
| *H01L 21/84* | (2006.01) |
| *H01L 27/12* | (2006.01) |
| *H01L 29/417* | (2006.01) |
| *H01L 21/762* | (2006.01) |

(Continued)

(52) U.S. Cl.
CPC .......... *H01L 29/78609* (2013.01); *H01L 21/84* (2013.01); *H01L 27/1203* (2013.01); *H01L 29/41783* (2013.01); *H01L 29/665* (2013.01); *H01L 29/66628* (2013.01); *H01L 29/7843* (2013.01); *H01L 21/76283* (2013.01); *H01L 21/76897* (2013.01); *H01L 21/76832* (2013.01); *H01L 21/76834* (2013.01)

(58) Field of Classification Search
CPC ............ H01L 29/7843; H01L 29/7846; H01L 29/665; H01L 29/78609
USPC .......................... 257/374, 349, 506; 438/424
See application file for complete search history.

(56) References Cited

U.S. PATENT DOCUMENTS

| | | | |
|---|---|---|---|
| 6,060,755 | A | 5/2000 | Ma et al. |
| 6,096,642 | A | 8/2000 | Wu |

(Continued)

FOREIGN PATENT DOCUMENTS

JP             1309380         12/1989

*Primary Examiner* — Theresa T Doan
(74) *Attorney, Agent, or Firm* — Scully, Scott, Murphy & Presser, P.C.; Yuanmin Cai

(57) ABSTRACT

After formation of a semiconductor device on a semiconductor-on-insulator (SOI) layer, a first dielectric layer is formed over a recessed top surface of a shallow trench isolation structure. A second dielectric layer that can be etched selective to the first dielectric layer is deposited over the first dielectric layer. A contact via hole for a device component located in or on a top semiconductor layer is formed by an etch. During the etch, the second dielectric layer is removed selective to the first dielectric layer, thereby limiting overetch into the first dielectric layer. Due to the etch selectivity, a sufficient amount of the first dielectric layer is present between the bottom of the contact via hole and a bottom semiconductor layer, thus providing electrical isolation for the ETSOI device from the bottom semiconductor layer.

9 Claims, 13 Drawing Sheets

(51) Int. Cl.
*H01L 21/768* (2006.01)
*H01L 29/66* (2006.01)
*H01L 29/78* (2006.01)

(56) References Cited

U.S. PATENT DOCUMENTS

| | | |
|---|---|---|
| 6,114,209 A | 9/2000 | Chu |
| 6,407,435 B1 | 6/2002 | Ma et al. |
| 6,677,646 B2 * | 1/2004 | Ieong et al. ............... 257/347 |
| 6,818,517 B1 | 11/2004 | Maes |
| 7,419,903 B2 | 9/2008 | Haukka et al. |
| 7,659,171 B2 | 2/2010 | Furukawa et al. |
| 7,838,915 B2 | 11/2010 | Choi et al. |
| 7,871,869 B2 | 1/2011 | Cartier et al. |
| 7,897,450 B2 | 3/2011 | Koehler et al. |
| 7,902,019 B2 | 3/2011 | Lee et al. |
| 8,216,904 B2 * | 7/2012 | Dove ........................ 438/296 |
| 2010/0038715 A1 | 2/2010 | Babich et al. |

\* cited by examiner

BORDERLESS CONTACT FOR ULTRA-THIN BODY DEVICES

CROSS REFERENCE TO RELATED APPLICATION

This application is a divisional of U.S. patent application Ser. No. 13/191,540, filed Jul. 27, 2011 the entire content and disclosure of which is incorporated herein by reference.

BACKGROUND

The present disclosure relates to semiconductor structures, and particularly to a borderless contact structure for extremely thin semiconductor-on-insulator (ETSOI) devices and methods of manufacturing the same.

Extremely thin semiconductor-on-insulator (ETSOI) devices refer to semiconductor devices formed on an extremely thin semiconductor-on-insulator (ETSOI) substrate. A typical ETSOI substrate has a top semiconductor layer, which is also referred to as an extremely thin semiconductor-on-insulator (ETSOI) layer, having a thickness from 5 nm to 50 nm. A buried insulator layer provided underneath the top semiconductor layer has a thickness from 10 nm to 100 nm. An ETSOI substrate can be employed to form various semiconductor devices that derive performance advantage through the reduced thickness of the top semiconductor layer and/or the reduced thickness of the buried insulator layer compared with normal semiconductor-on-insulator (SOI) substrate.

For example, the reduction in the thickness of the top semiconductor layer provides full depletion of the channel, thereby enhancing the electrical control of the channel by the gate electrode and reducing the leakage current in a field effect transistor. Further, the reduction in the thickness of the buried insulator layer can enhance control by a back gate electrode in back-gated field effect transistors.

While ETSOI devices, and especially ETSOI field effect transistors (FETs), are promising candidates for advanced high performance devices, several manufacturing issues need to be resolved before ETSOI devices can be manufactured with high yield. One such issue is formation of divots around and/or over shallow trench isolation structures that are employed to provide lateral electrical isolation between adjacent devices. Specifically, etch steps and/or cleaning steps are repeatedly employed to recess various material layers and/or to clean surfaces before further processing. Divots are formed around shallow trench isolation structures during such etch steps and/or cleaning steps. For example, silicon oxide-based shallow trench isolation structures are susceptible to HF-based etches that can be employed to preclean semiconductor surfaces before epitaxy or formation of a gate dielectric.

Divots formed during such etch steps and/or cleaning steps can extend to a bottom semiconductor layer located underneath the buried insulator layer. The divots can be filled with a conductive material during formation of contact via structures, and a direct electrical short can be formed to the bottom semiconductor layer by the conductive material that is deposited in the divots as an extension of the contact via structures. Even if a direct electrical short is avoided, a conductive material deposited in divots can lead to an unacceptable level of leakage current between a portion of the bottom semiconductor layer and an electrical node that should be electrically isolated from the bottom semiconductor layer.

SUMMARY

Thus, a method of ensuring sufficient electrical isolation between a bottom semiconductor layer of an ETSOI substrate and electrical nodes in a top semiconductor layer of the ETSOI substrate despite divot formation during processing steps is needed to provide functional and reliable ETSOI devices.

After formation of a semiconductor device on a semiconductor-on-insulator (SOI) layer, a first dielectric layer is formed over a recessed top surface of a shallow trench isolation structure. The first dielectric layer may, or may not, be planarized over the shallow trench isolation structure. A second dielectric layer that can be etched selective to the first dielectric layer is deposited over the first dielectric layer. A contact-level dielectric layer is deposited over the second dielectric layer and is planarized. A contact via hole is formed through the contact-level dielectric layer, the second dielectric layer, and optionally through a first dielectric layer for a device component located in, or on, a top semiconductor layer by an etch. The etch removes the second dielectric layer selective to the first dielectric layer, thereby limiting overetch into the first dielectric layer. If the first dielectric layer is present above the device component, a timed etch can be employed. Due to the etch selectivity, a sufficient amount of the first dielectric layer is present between the bottom of the contact via hole and a bottom semiconductor layer, thus providing electrical isolation for the ETSOI device from the bottom semiconductor layer.

According to an aspect of the present disclosure, a method of forming a semiconductor structure includes: forming a shallow trench isolation structure in a substrate, wherein the shallow trench isolation structure has a top surface that is recessed below a top surface of a top semiconductor layer of the substrate; forming a semiconductor device on the top semiconductor layer of the substrate; forming a dielectric material portion having a first planar top surface and including a first dielectric material on the top surface of the shallow trench isolation structure; forming a contiguous dielectric layer including a second dielectric material that is different from the first dielectric material on the dielectric material portion; planarizing the contiguous dielectric layer, wherein a second planar top surface extending over the first planar top surface and the semiconductor device is formed on the contiguous dielectric layer; forming a contact-level dielectric layer located over the contiguous dielectric layer; and forming at least one contact via structure through the contact-level dielectric layer and the contiguous dielectric layer and directly on a component of the semiconductor device located above the top surface of the top semiconductor layer.

According to another aspect of the present disclosure, another method of forming a semiconductor structure includes: forming a shallow trench isolation structure in a substrate, wherein the shallow trench isolation structure has a top surface that is recessed below a top surface of a top semiconductor layer of the substrate; forming a semiconductor device on the top semiconductor layer of the substrate; forming a dielectric material layer including a first dielectric material directly on the top surface of the shallow trench isolation structure and a top surface of a component of the semiconductor device; forming a contiguous dielectric layer including a second dielectric material that is different from the first dielectric material directly on surfaces of the dielectric material layer above the shallow trench isolation structure and above the semiconductor device; forming a contact-level dielectric layer over the contiguous dielectric layer; and forming at least one contact via structure through the contact-level dielectric layer, the contiguous dielectric layer, and the dielectric material layer and directly on a component of the semiconductor device located above the top surface of the top semiconductor layer.

According to yet another aspect of the present disclosure, a semiconductor structure includes: a semiconductor device located on a top semiconductor layer of a substrate; a shallow trench isolation structure having a top surface that is recessed below a top surface of the top semiconductor layer; a dielectric material portion including a first dielectric material, contacting the top surface of the shallow trench isolation structure, and having a first planar top surface; a contiguous dielectric layer including a second dielectric material that is different from the first dielectric material, contacting the dielectric material portion, and having a second planar top surface extending over the first planar top surface and the semiconductor device; a contact-level dielectric layer located over the contiguous dielectric layer; and at least one contact via structure extending through the contact-level dielectric layer and the contiguous dielectric layer and contacting a component of the semiconductor device located above the top surface of the top semiconductor layer.

According to still another aspect of the present disclosure, another semiconductor structure includes: a semiconductor device located on a top semiconductor layer of a substrate; a shallow trench isolation structure having a top surface that is recessed below a top surface of the top semiconductor layer; a dielectric material layer including a first dielectric material, contacting the top surface of the shallow trench isolation structure, and contacting a top surface of a component of the semiconductor device; a contiguous dielectric layer including a second dielectric material that is different from the first dielectric material and contacting surfaces of the dielectric material layer above the shallow trench isolation structure and above the semiconductor device; a contact-level dielectric layer located over the contiguous dielectric layer; and at least one contact via structure extending through the contact-level dielectric layer, the contiguous dielectric layer, and the dielectric material layer, and contacting a component of the semiconductor device located above the top surface of the top semiconductor layer.

DETAILED DESCRIPTION

Figure 1:
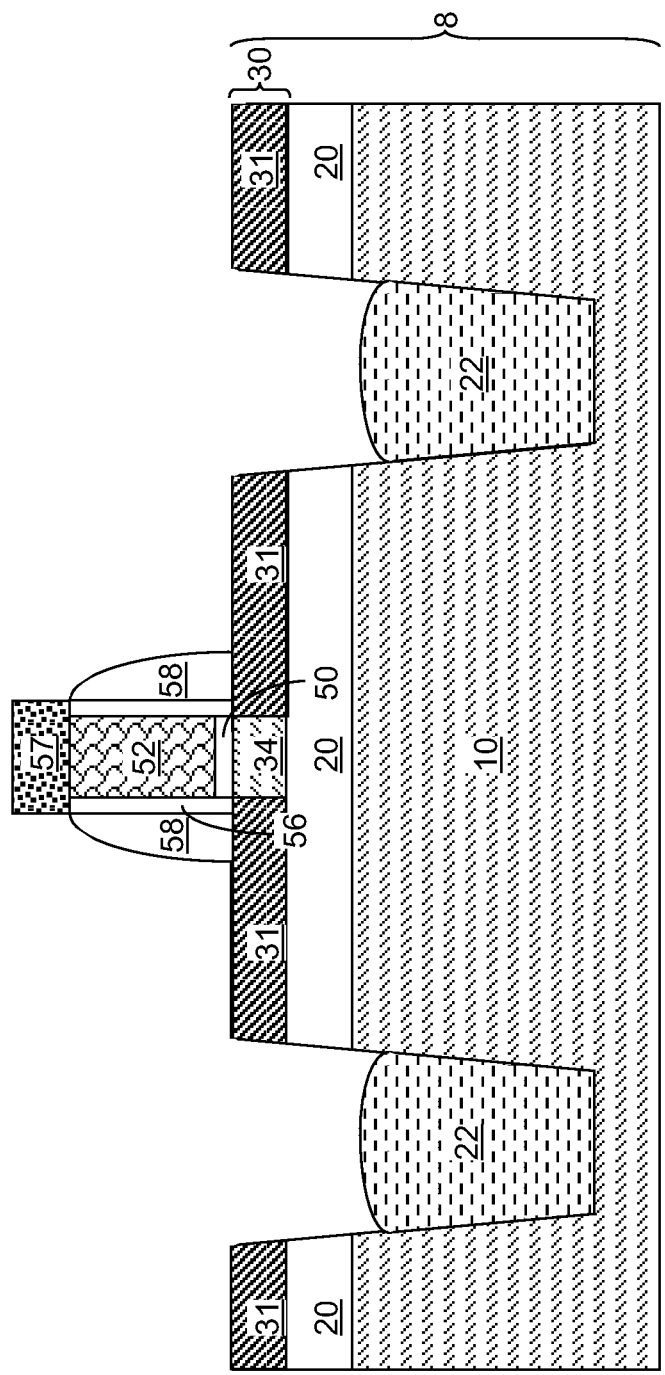
FIG. 1 is a vertical cross-sectional view of a first exemplary semiconductor structure according to a first embodiment of the present disclosure after formation of a gate stack, a gate spacer, and source and drain regions on a semiconductor-on-insulator substrate.

As stated above, the present disclosure relates to a borderless contact structure for extremely thin semiconductor-on-insulator (ETSOI) devices and methods of manufacturing the same, which are now described in detail with accompanying figures. Like and corresponding elements mentioned herein and illustrated in the drawings are referred to by like reference numerals. The drawings are not necessarily drawn to scale.

Referring to FIG. 1, a first exemplary semiconductor structure according to a first embodiment of the present disclosure includes gate-level layers formed on a semiconductor substrate 8. The substrate 8 can be a semiconductor-on-insulator (SOI) substrate including a vertical stack of a handle substrate 10, a buried insulator layer 20, and a top semiconductor layer 30. The handle substrate 10 can include a semiconductor material, a dielectric material, a conductive material, or a combination thereof. For example, the handle substrate 10 can be a single crystalline silicon substrate. The buried insulator layer 20 includes a dielectric material such as silicon oxide, silicon nitride, silicon oxynitride, or a combination thereof. The top semiconductor layer 30 includes a semiconductor material such as silicon, germanium, a silicon-germanium alloy, a III-V compound semiconductor, a II-VI compound semiconductor, any other semiconductor material known in the art, or combinations thereof. The semiconductor material in the top semiconductor layer 30 can be single crystalline. Alternatively, the semiconductor substrate 8 can be a bulk substrate instead of an SOI substrate in which a semiconductor material contiguously extends from a topmost surface of the semiconductor substrate 8 to a bottommost surface of the semiconductor substrate 8. In one embodiment, the semiconductor substrate 8 can be an extremely thin semiconductor-on-insulator (ETSOI) substrate.

Shallow trench isolation structures 22 can be formed in the top semiconductor layer 30. For example, shallow trenches can be formed through the top semiconductor layer 30, the buried insulator layer 20, and an upper portion of the handle substrate 10. The shallow trenches are filled with a dielectric material such as silicon oxide, silicon nitride, silicon oxynitride, or a combination thereof. Excess dielectric material above the top surface of the top semiconductor layer 30 can be removed by a planarization process such as chemical mechanical planarization (CMP) to form the shallow trench isolation structures 22. The remaining portions of the top semiconductor layer 30 constitute active regions on which semiconductor devices can be formed.

In one embodiment, the top surfaces of the shallow trench isolation structures 22 can be initially substantially coplanar with the top surface of the top semiconductor layer 30. Note that FIG. 1 illustrates trench isolation structures 22 after subsequent processing steps that recess the top surfaces of the trench isolation structures 22 (to be explained below in more details). As used herein, a first element is "substantially coplanar" with a second element if the coplanarity between the first element and the second element is limited only by the capability of the processing steps that intend to make the surfaces of the first element and the second element coplanar with each other. Practically, the top surfaces of the shallow trench isolation structures 22 can be coplanar with the top surface of the top semiconductor layer 30 within 5 nm or within the thickness of the top semiconductor layer 30. Thus, the protrusion or recessing of the top surfaces of the shallow trench isolation structures 22 relative to the top surface of the top semiconductor layer 30 can be less than 5 nm or less than the thickness of the top semiconductor layer 30.

A semiconductor device is subsequently formed on the semiconductor substrate 8. The semiconductor device can be any semiconductor device as known in the art. During the formation of the shallow trench isolation structures 22, the shallow trench isolation structures 22 can be formed in a shallow trench laterally that laterally surrounds a bottom portion of the semiconductor device to be subsequently formed. The lateral surrounding of the semiconductor device provides lateral electrical isolation to the semiconductor device, and the buried insulator layer 20 provides vertical electrical isolation of the semiconductor device.

In one embodiment, the semiconductor device can be a field effect transistor. In this embodiment, a gate dielectric 50, a gate conductor 52, a gate cap dielectric 57, gate sidewall spacers 56, and gate spacers 58 are formed employing various processing steps as known in the art. The gate dielectric 50 includes a dielectric material, which can be silicon oxide, silicon nitride, silicon oxynitride, or a stack thereof. Alternately, the gate dielectric 50 can be a high dielectric constant (high-k) material layer having a dielectric constant greater than 8.0. In one embodiment, the gate dielectric 50 can include a dielectric metal oxide, which is a high-k material containing a metal and oxygen, and such metal oxides are known in the art as high-k gate dielectric materials. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc.

The gate conductor 52 includes a conductive material, which can be a doped semiconductor material, a metallic material, or a combination thereof. The doped semiconductor material can include doped polysilicon, doped polycrystalline germanium, a doped silicon-germanium alloy, or any other doped semiconductor material. The metallic material, if employed, can be selected to optimize the performance of a transistor to be subsequently formed. The gate conductor 52 can be deposited, for example, by chemical vapor deposition (CVD) and/or physical vapor deposition and/or any other deposition methods available in the art.

The gate cap dielectric 57 includes a dielectric material such as silicon nitride, silicon oxide, organosilicate glass (OSG), a high dielectric constant (high-k) material, a dielectric metal oxide, a dielectric metal nitride, or a combination thereof.

Gate sidewalls spacers 56, if present, can be formed, for example, by thermal conversion or plasma conversion of the surface portions of the gate conductor. The thermal conversion or the plasma conversion can be oxidation, nitridation, or a combination thereof. For example, the gate conductor 52 can include a doped semiconductor material such as doped polysilicon, and the gate sidewall spacers 56 can include an oxide or a nitride of the doped semiconductor material of the gate conductor 52.

Ion implantation can be performed employing the assembly of the gate dielectric 50, the gate conductor 52, the gate cap dielectric 57, and the gate sidewall spacers 56 as an implantation mask. The implanted portions of the top semiconductor layer 30 can become planar source/drain regions 31, i.e., source regions and drain regions located within the top semiconductor layer 30, of the field effect transistor. The unimplanted remaining portion of the top semiconductor layer between a pair of planar source/drain regions 31 is a body region 34, which has the opposite type of doping as the planar source/drain regions 31.

The gate spacers 58 include a dielectric material such as silicon oxide, silicon nitride, or a combination thereof. The gate spacers 58 can be formed, for example, by deposition of a conformal dielectric layer followed by an anisotropic etch that removes horizontal portions of the conformal dielectric layer. The remaining vertical portions of the conformal dielectric layer are the gate spacers 58.

Various cleaning steps, wet etch steps, and dry etch steps are employed between the formation of the shallow trench isolation structures and the last processing step for formation of the gate spacers 58. As a consequence, the top surfaces of the shallow trench isolation structures 22 are gradually recessed below the top surface of the top semiconductor layer, and typically below the top surface of the buried insulator layer 20 in the case of ETSOI substrate as illustrated in FIG. 1. Further, in some cases, the top surfaces of the shallow trench isolation structures 22 can be recessed below the top surface of the handle substrate 10.

Figure 2:
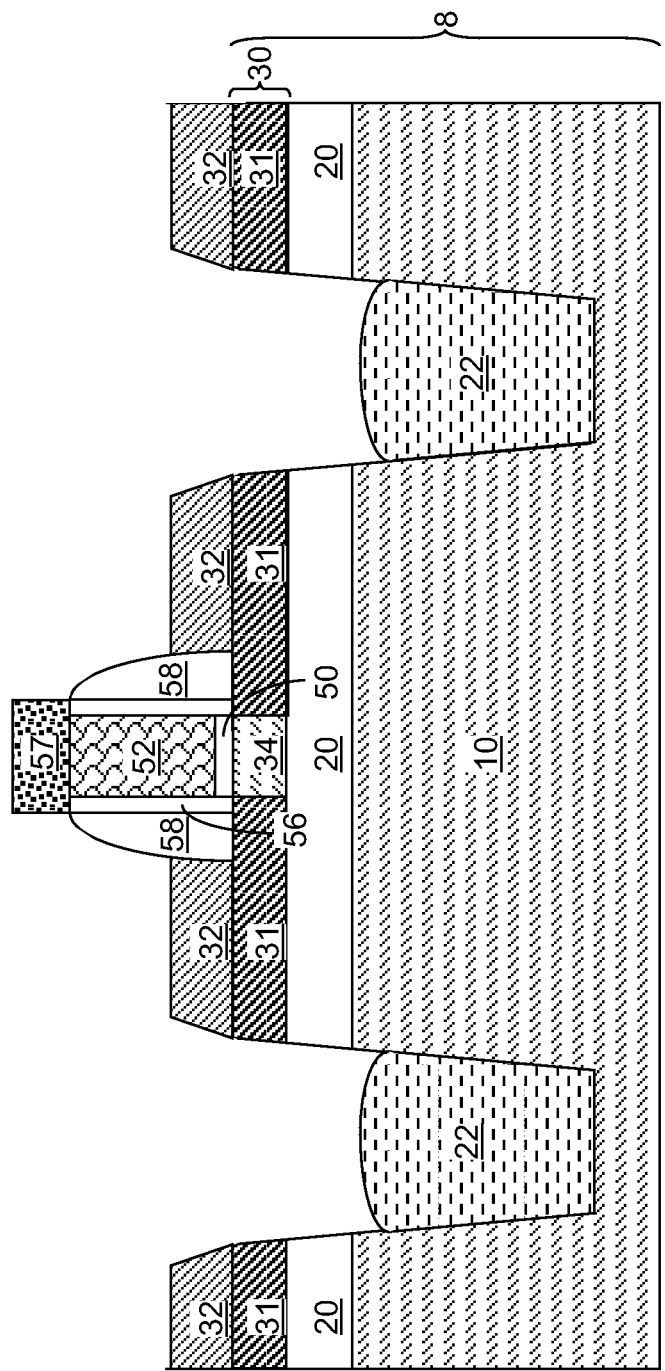
FIG. 2 is a vertical cross-sectional view of the first exemplary semiconductor structure according to the first embodiment of the present disclosure after formation of raised source and drain regions by selective epitaxy.

Referring to FIG. 2, raised source and drain regions 32 can be formed, for example, by selective epitaxy. During a selective epitaxy step, a semiconductor-containing reactant and an etchant are simultaneously or alternately flowed into a reaction chamber including the first exemplary semiconductor structure. Dopants having the same conductivity type as the doping of the planar source/drain regions 31 are introduced into the raised source/drain regions 32 by in-situ doping or by ion implantation. The raised source/drain regions 32 include a doped semiconductor material such as doped silicon, doped germanium, a doped silicon-germanium alloy, or a doped compound semiconductor material. In some embodiments, the raised source/drain regions 32 are epitaxially aligned to an underlying planar source/drain region 31. The thickness of the raised source/drain regions 32 can be from 3 nm to 200 nm, and typically from 10 nm to 50 nm, although lesser or greater thicknesses can also be employed. A stack of a raised source/drain region 32 and an underlying planar source/drain region 31 collectively constitute a "source/drain," which herein refers to a source, a drain, or a common node that functions as a source of a transistor and a drain of another transistor.

Selective epitaxy typically requires a preclean step to remove native oxides of the semiconductor material on the exposed surfaces of the planar source/drain regions 31 prior to deposition of the raised source/drain regions 32. Thus, the recessing of the top surface of the shallow trench isolation structures 22 below the top surface of the buried insulator layer 20 and/or below the top surface of the handle substrate 10 can be exacerbated by the preclean process that is performed before the selective epitaxy process.

Figure 3:
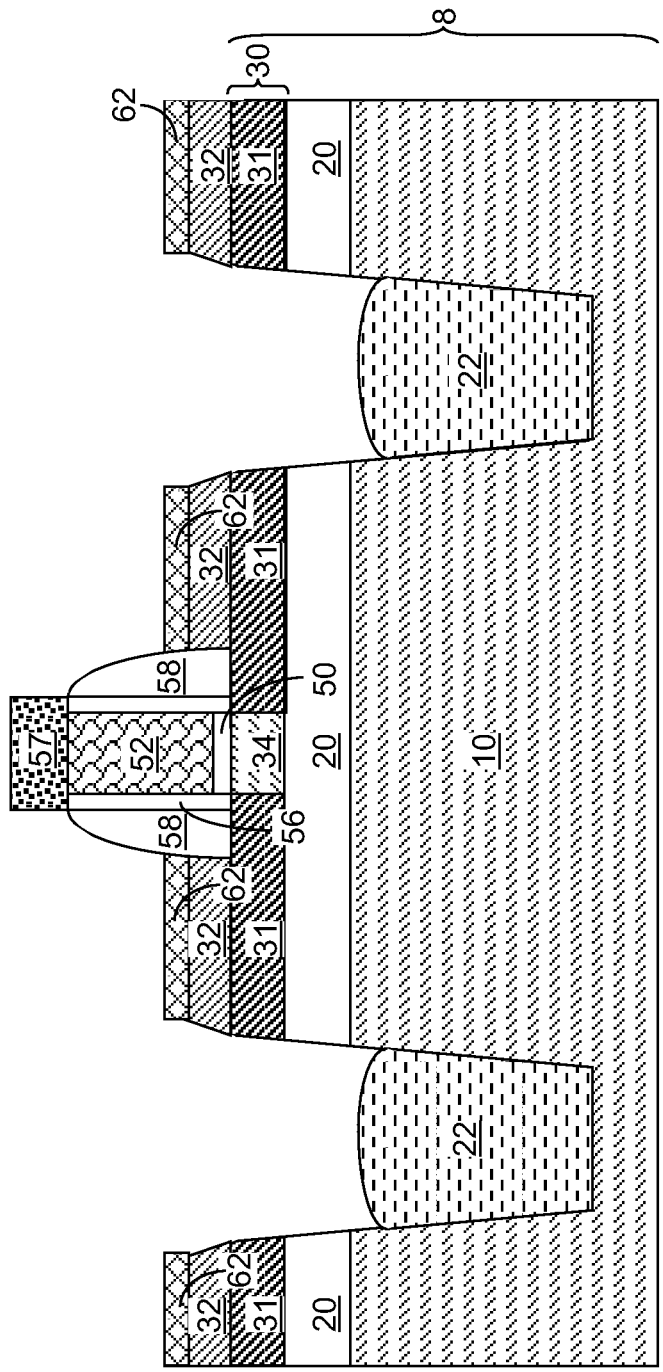
FIG. 3 is a vertical cross-sectional view of the first exemplary semiconductor structure according to the first embodiment of the present disclosure after formation of various metal semiconductor alloy regions.

Referring to FIG. 3, source/drain metal semiconductor alloy regions 62, i.e., source metal semiconductor alloy regions and drain metal semiconductor alloy regions, are formed on the raised source/drain regions 32. The source/drain metal semiconductor alloy regions 62 includes a compound of a semiconductor material of the raised source/drain regions 32 and a metal. For example, if the raised source/drain regions 32 include silicon, the source/drain metal semiconductor alloy regions 62 can include a metal silicide. The source/drain metal semiconductor alloy regions 62 can be formed, for example, by depositing a blanket metal layer on the exposed top surfaces of the first exemplary semiconductor structure, inducing a reaction between the metal in the blanket metal layer and the semiconductor material in the raised source/drain regions 32 to form the source/drain metal semiconductor alloy regions 62, and removing unreacted portions of the blanket metal layer selective to the source/drain metal semiconductor alloy regions 62.

Figure 4:
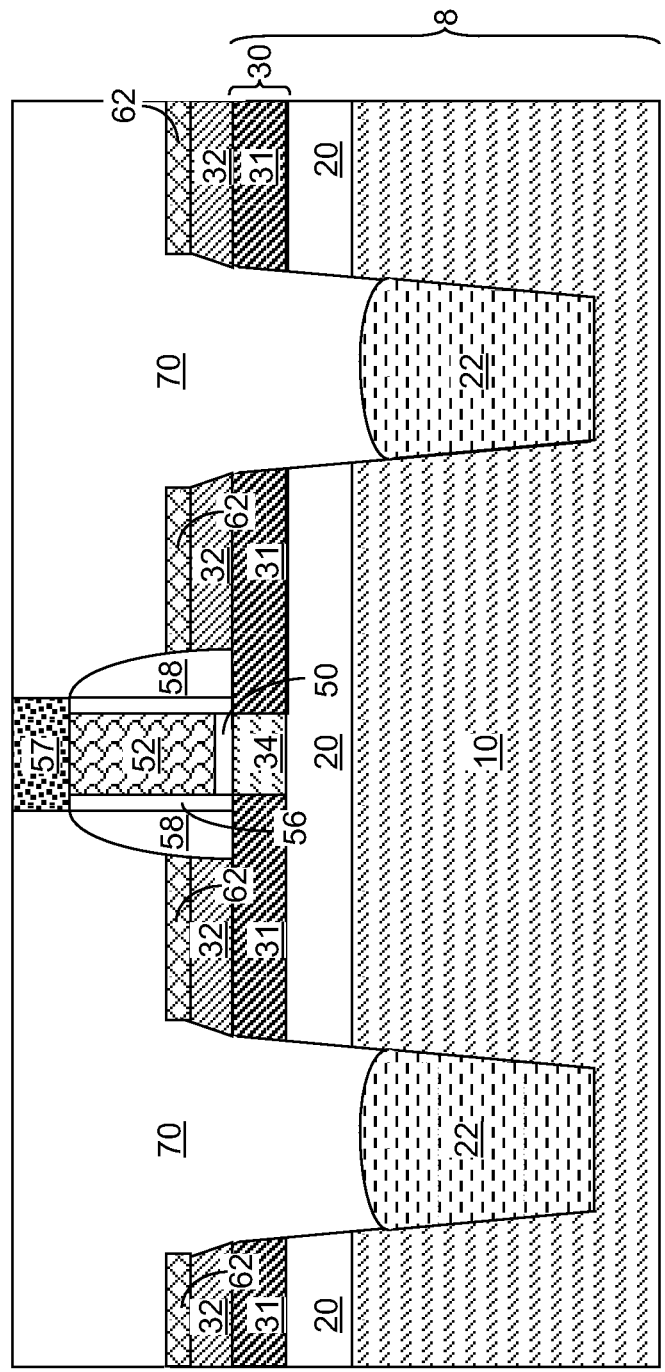
FIG. 4 is a vertical cross-sectional view of the first exemplary semiconductor structure according to the first embodiment of the present disclosure after deposition and planarization of a first dielectric layer.

Referring to FIG. 4, a first dielectric layer 70 including a first dielectric material is deposited, for example, by chemical vapor deposition (CVD) or spin coating, and is subsequently planarized employing a patterned structure provided within the first exemplary semiconductor structure as a stopping layer. The first dielectric layer 70 is deposited directly on the semiconductor device, which can be the field effect transistor in one embodiment. For example, the patterned structure can be the gate cap dielectric 57, which includes a dielectric material different from the first dielectric material. Further, the first dielectric layer 70 is deposited within the recessed portions of the shallow trenches and directly on the top surface of the shallow trench isolation structures 22 so that the combination of the shallow trench isolation structures 22 and the first dielectric layer 70 fill all shallow trenches below the top surface of the top semiconductor layer 30.

The first dielectric material can be silicon oxide, silicon nitride, or a dielectric metal oxide having a dielectric constant greater than 8.0. Non-limiting examples of dielectric metal oxides having a dielectric constant greater than 8.0 include $HfO_2$, $ZrO_2$, $Ta_2O_5$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof, in which each value of x is independently from 0.5 to 3 and each value of y is independently from 0 to 2.

Figure 5:
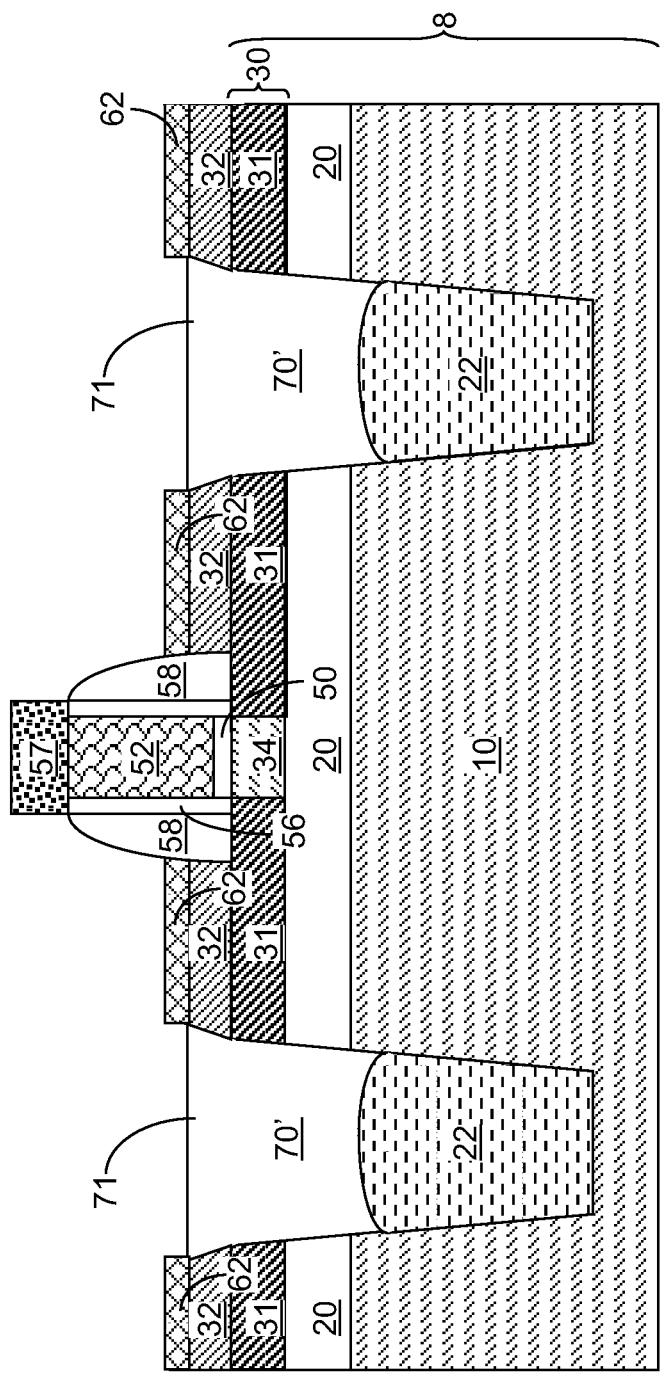
FIG. 5 is a vertical cross-sectional view of the first exemplary semiconductor structure according to the first embodiment of the present disclosure after selective recessing of the first dielectric layer.

Referring to FIG. 5, the first dielectric material of the first dielectric layer 70 is recessed selective to components of the semiconductor device, which can be a field effect transistor in one embodiment. For example, the first dielectric material of the first dielectric layer 70 can be recessed selective to the dielectric materials of the gate cap dielectric 57 and the gate spacers 58 and selective to the metal semiconductor alloy material of the source/drain metal semiconductor alloy regions 62. In order to enable selective etching, the first dielectric material is a different material than the dielectric material of the gate cap dielectric 57 and the gate spacers 58. For example, the gate cap dielectric 58 and the gate spacers 58 can include silicon nitride, and the first dielectric material of the first dielectric layer 70 can be silicon oxide or a dielectric metal oxide having a dielectric constant greater than 8.0. Alternately, the gate cap dielectric 57 and the gate spacers 58 can include silicon oxide, and the first dielectric material can be silicon nitride or a dielectric metal oxide having a dielectric constant greater than 8.0. Yet alternately, the top surface of the gate cap dielectric 57 and/or the outer surfaces of the gate spacer 58 can be a species of dielectric metal oxides having a dielectric constant greater than 8.0, and the first dielectric material can be silicon oxide, silicon nitride, or another species of dielectric metal oxides having a dielectric constant greater than 8.0 that can be removed selective to the species of dielectric metal oxides selected for the top surface of the gate cap dielectric 57 and/or the outer surfaces of the gate spacer 58.

The recessing of the first dielectric layer 70 can be performed employing a dry etch or a wet etch. In one embodiment, the dry etch can be a reactive ion etch. Use of a dry etch for the recessing of the first dielectric layer 70 has the advantage of avoiding accidental divot formation in the remaining portions of the first dielectric layer 70. The remaining portions of the dielectric material layer 70 after the recessing form dielectric material portions 70'. Each dielectric material portion 70' has a first planar top surface 71, and includes the first dielectric material. In one embodiment, a dielectric material portion 70' may contiguously laterally surround a lower portion of the semiconductor device included in the top semiconductor layer 30. For example, a dielectric material portion 70' may contiguously surround planar source/drain regions 31 and a body region 34 of a field effect transistor. Further, each dielectric material portion 70' is located directly on the top surface of a shallow trench isolation structure 22. Because the recessing of the first dielectric layer 70 is performed simultaneously across the first exemplary semiconductor structure, all portions of the first planar top surface 71 of the dielectric material portions 70' are coplanar among one another.

The first planar top surface 71 of the dielectric material portions 70' are located above the top surface of the top semiconductor layer 30. If the semiconductor device is a field effect transistor, the first planar top surface 71 can be located between the level of the top surface of the top semiconductor layer 30 and the top surface of the source/drain metal semiconductor alloy regions 62.

Figure 6:
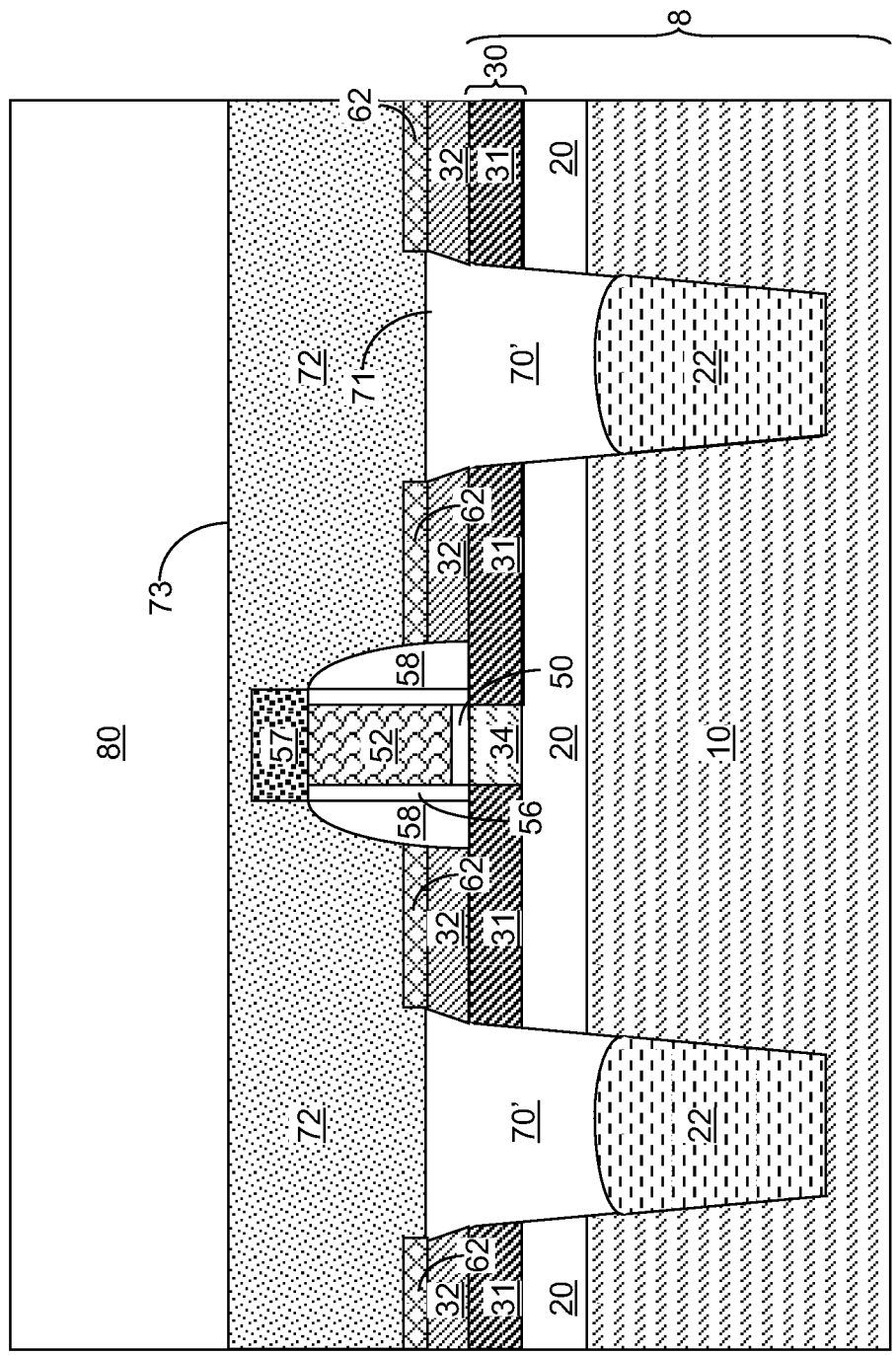
FIG. 6 is a vertical cross-sectional view of the first exemplary semiconductor structure according to the first embodiment of the present disclosure after formation of a second dielectric layer, planarization of the second dielectric layer, and formation of a contact-level dielectric layer.

Referring to FIG. 6, a second dielectric layer 72 is deposited and planarized above the semiconductor device and the dielectric material portions 70'. The second dielectric layer 72 is a contiguous dielectric layer that contacts all planar top surfaces 71 of the first dielectric layer 70 and other exposed surfaces of the semiconductor device such as a field effect transistor.

The second dielectric layer 72 includes a second dielectric material, which is different from the first dielectric material so that the second dielectric material can be subsequently removed with high selectivity to the first dielectric material.

For example, if the first dielectric material of the dielectric material portions 70' includes silicon nitride, and the second dielectric material of the second dielectric layer 72 can be silicon oxide or a dielectric metal oxide having a dielectric constant greater than 8.0. Alternately, if the first dielectric material includes silicon oxide, the second dielectric material can be silicon nitride or a dielectric metal oxide having a dielectric constant greater than 8.0. Yet alternately, if the first dielectric material is a first species of dielectric metal oxides having a dielectric constant greater than 8.0, the second dielectric material can be silicon oxide, silicon nitride, or a second species of dielectric metal oxides having a dielectric constant greater than 8.0 that can be removed selective to the first species of dielectric metal oxides.

In one embodiment, the second dielectric layer 72 can include a stress-generating silicon nitride material. The stress-generating silicon nitride material can be a tensile-stress-generating silicon nitride material, or can be a compressive-stress-generating silicon nitride material.

The second dielectric layer 72 can be deposited, for example, by chemical vapor deposition (CVD) or spin coating. In one embodiment, the thickness of the second dielectric layer 72 as deposited is selected so that the lowest level of the top surface of the second dielectric layer 72 is above the topmost surface of the semiconductor device, e.g., the topmost surface of the gate cap dielectric 57. In another embodiment, the lowest level of the top surface of the second dielectric layer 72 can be located below the topmost surface of the semiconductor device.

In one embodiment, the second dielectric layer 72 is deposited employing a self-planarizing deposition process such as spin coating. In this embodiment, the second dielectric layer 72 is planarized immediately after deposition. In another embodiment, the second dielectric layer 72 is deposited employing a non-self-planarizing deposition process such as chemical vapor deposition process. In this embodiment, the second dielectric layer 72 is planarized employing a planarization process, which can be chemical mechanical planarization (CMP).

As a contiguous dielectric layer, the second dielectric layer 72 contiguously extends over the entirety of the semiconductor device and the entirety of the stack of a shallow trench isolation structure 22 and the dielectric material portion 70' that are located below. A second planar top surface 73 of the second dielectric layer 72 extends over the first planar top surface 72 and the semiconductor device underneath. In one embodiment, the second planar top surface 73 of the second dielectric layer 72 is located above the level of the topmost surface of the underlying semiconductor device. For example, the second planar top surface 73 of the second dielectric layer 72 can be located above the topmost surface of the gate cap dielectric 57. In another embodiment, the second planar top surface 73 of the second dielectric layer 72 can be located below the level of the topmost surface of the underlying semiconductor device. The thickness of the second dielectric layer, as measured between the first planar top surface 71 of the dielectric material portions 70' and the second planar top surface 73 of the second dielectric layer 72, can be from 5 nm to 300 nm, and typically from 20 nm to 150 nm, although lesser and greater thicknesses can also be employed.

A contact-level dielectric layer 80 is deposited over the second dielectric layer 72. The contact-level dielectric layer 80 includes a dielectric material such as organosilicate glass, undoped silicate glass, doped silicate glass, or silicon nitride. In one embodiment, the contact-level dielectric layer 80 includes a dielectric material that is different from the second dielectric material. The contact-level dielectric layer 80 can be deposited, for example, by chemical vapor deposition (CVD) or spin-coating. The thickness of the contact-level dielectric layer 80 can be from 50 nm to 500 nm, although lesser and greater thicknesses can also be employed.

Figure 7:
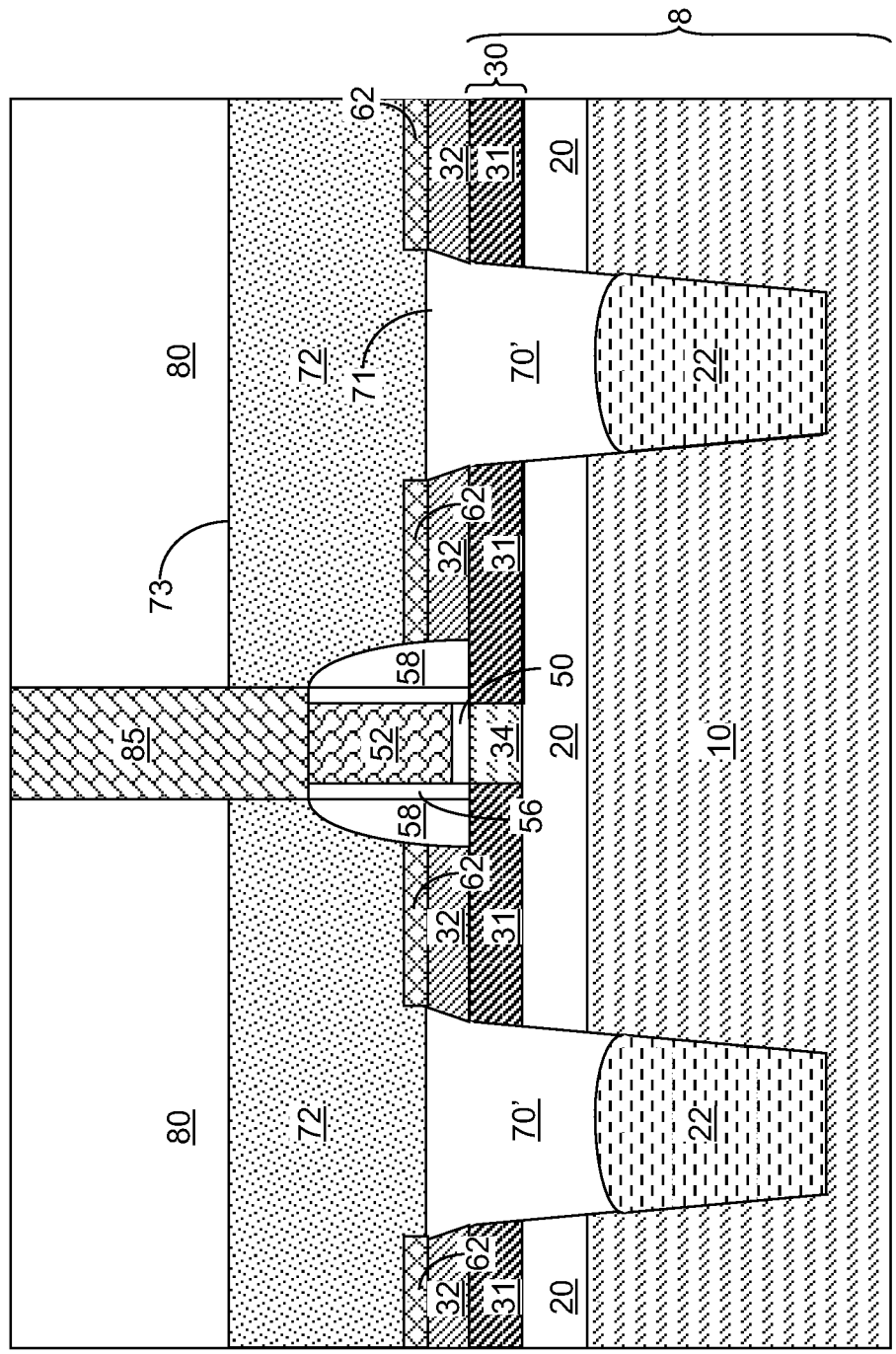
FIG. 7 is a vertical cross-sectional view of the first exemplary semiconductor structure according to the first embodiment of the present disclosure after formation of a gate contact via structure.

Referring to FIG. 7, various contact via structures can be formed directly on components of the semiconductor device. For example, a gate contact via structure 85 can be formed directly on the gate conductor 52. The gate contact via structure 85 can be formed by forming a gate contact via hole through the contact-level dielectric layer 80, the second dielectric layer 72, and the gate cap dielectric 57, filling the gate contact via hole with a conductive material, and subsequently removing excess conductive material above the top surface of the contact-level dielectric material layer 80. The gate contact via hole can be formed, for example, by employing an etch, which can be a dry etch such as a reactive ion etch.

Figure 8:
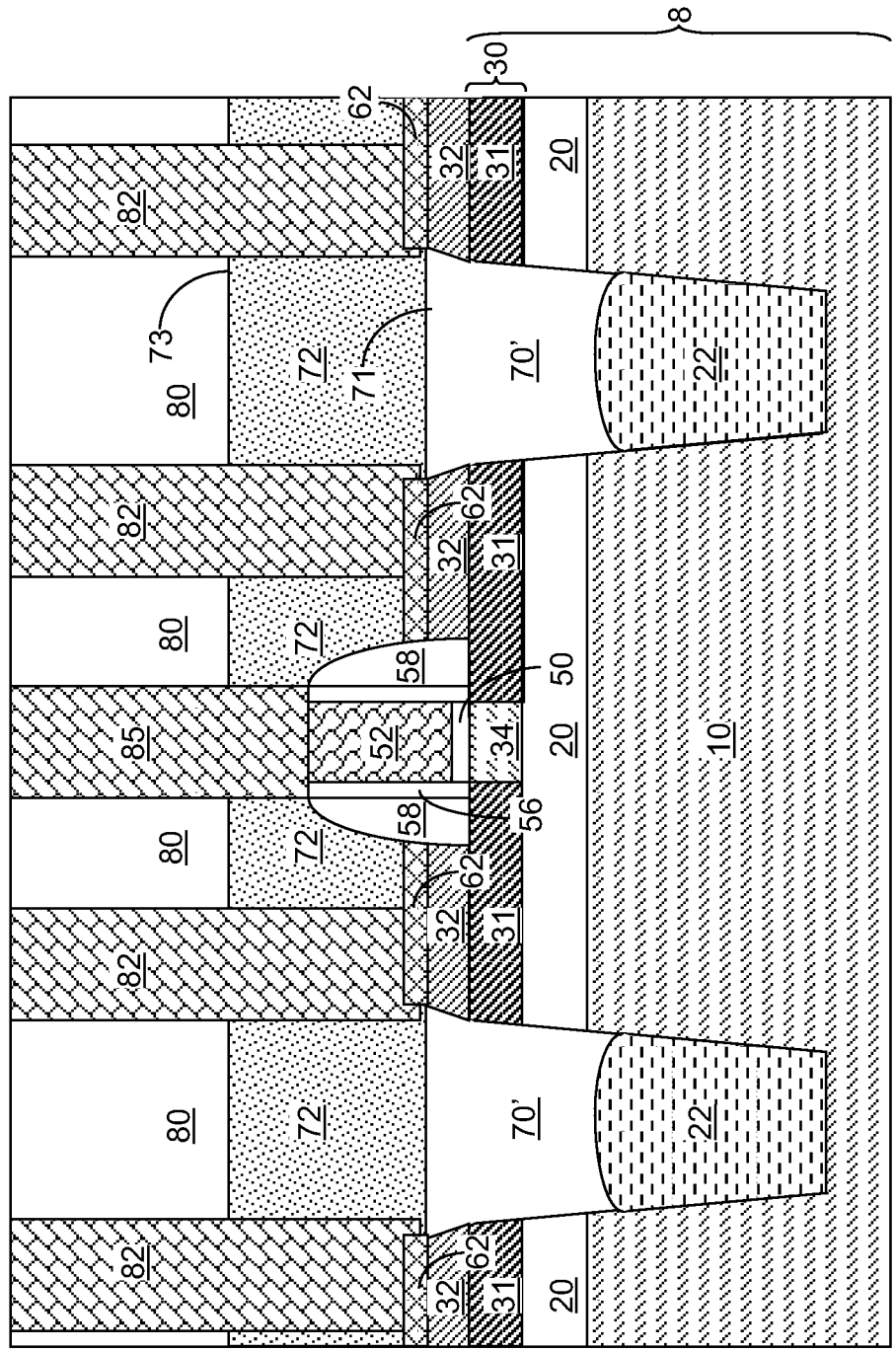
FIG. 8 is a vertical cross-sectional view of the first exemplary semiconductor structure according to the first embodiment of the present disclosure after formation of source and drain contact via structures.

Referring to FIG. 8, source and drain contact via structures 82, i.e., source contact via structures and drain contact via structures, are formed through the contact-level dielectric material layer 80 and the second dielectric layer 72. The source and drain contact via structures 82 can be formed directly on components of the field effect transistor that are conductively connected to source and drain regions (31, 32) of the field effect transistor. As used herein, a first component is "conductively connected" to a second component is an electrically conductive path renders the voltages at the first component and the second component substantially the same. The source and drain contact via structures 82 can be formed by forming source and drain contact via holes through the contact-level dielectric layer 80 and the contiguous dielectric layer of the second dielectric layer 72, filling the source and drain contact via holes with a conductive material, and subsequently removing excess conductive material above the top surface of the contact-level dielectric material layer 80. The source and drain contact via holes can be formed, for example, by employing an etch, which can be a dry etch such as a reactive ion etch.

In one embodiment, the etch process can employ an etch chemistry that removes the second dielectric material of the second dielectric layer 72 selective to the first dielectric material of the dielectric material portions 70'. Thus, the source and drain contact via holes do not extend into the dielectric material portions 70' or the extent of any extension of the source and drain contact via holes into the dielectric material portions 70' is limited. Specifically, the bottommost portion of any extension of the source and drain contact via holes into the dielectric material portions 70' is located above the level of the top surface of the handle substrate 10, and preferably above the level of the top surface of the buried insulator layer 20, and more preferably above the top surface of the top semiconductor layer 30.

In general, for any type of semiconductor device, at least one contact via structure can be formed through the contact-level dielectric layer 80 and the second dielectric layer 72, which is a contiguous dielectric layer, and directly on a component of the semiconductor device located above the top surface of the top semiconductor layer 30. The first planar top surface 71 can be recessed below a topmost surface of the component, and the second planar top surface 73 can be located above the level of the topmost surface of the semiconductor device.

If an etch that selectively removes the second dielectric material of the second dielectric layer 72 selective to the first dielectric material of the dielectric material portions 70' is employed, any extension of various contact via structures below the first planar top surface 71 of the dielectric material portions 70' can be limited. Thus, the bottommost portion of contact via structures can be located above the level of the top surface of the handle substrate 10, and preferably above the level of the top surface of the buried insulator layer 20, and more preferably above the top surface of the top semiconductor layer 30, thereby eliminating potential electrical shorts between a component on the top semiconductor layer 30 and any portion of the handle substrate 10.

Figure 9:
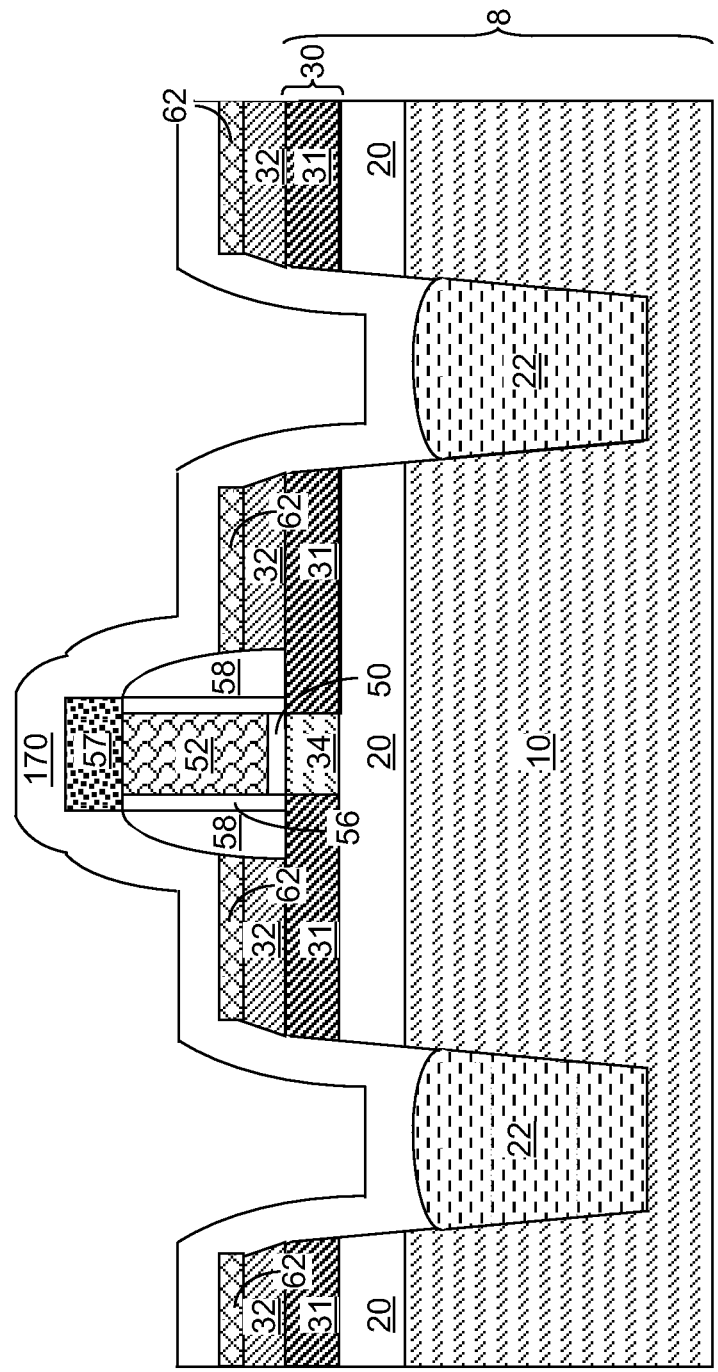
FIG. 9 is a vertical cross-sectional view of a second exemplary semiconductor structure according to a second embodiment of the present disclosure after deposition of a first dielectric layer.

Referring to FIG. 9, a second exemplary semiconductor structure according to a second embodiment of the present disclosure can be derived from the first exemplary semiconductor structure of FIG. 3 by depositing a first dielectric layer 170. The first dielectric layer 170 is a dielectric material layer including a first dielectric material. The first dielectric layer 170 can be a conformal dielectric layer that can be deposited, for example, by chemical vapor deposition (CVD).

The first dielectric layer 170 is deposited directly on the top surface of the shallow trench isolation structures 22 and various top surfaces of components of the semiconductor device. For example, the first dielectric layer 170 can be deposited directly on source/drain metal semiconductor alloy regions 62, the gate spacers 58, and the gate cap dielectric 57 of a field effect transistor. In one embodiment, if the top surface of the shallow trench isolation structures 22 are recessed below the top surface of the handle substrate 10, a bottom surface of the first dielectric layer 170 can contiguously extend from a sidewall surface of the handle substrate 10 to top surfaces of a component of the semiconductor device along a sidewall of a shallow trench and surfaces of the semiconductor device. For example, a bottom surface of the first dielectric layer 170 can contiguously extend from a sidewall surface of the handle substrate 10 to top surfaces of a source/drain metal semiconductor alloy region 62 along a sidewall of a shallow trench and surfaces of a field effect transistor (such as surfaces of source/drain regions (31, 32) of the field effect transistor).

The first dielectric layer 70 is deposited within the recessed portions of the shallow trenches and directly on the top surface of the shallow trench isolation structures 22 so that the combination of the shallow trench isolation structures 22 and the first dielectric layer 70 fill all shallow trenches below the top surface of the top semiconductor layer 30. If the top surface of the shallow trench isolation structures 22 is recessed below the top surface of the handle substrate 10, a portion of the first dielectric layer 170 is located below the level of the top surface of the handle substrate 10. Depending on embodiments, a top surface of the first dielectric layer 170 can be located below the level of the top semiconductor layer 30, or even below the top surface of the buried insulator layer 20. The thickness of the first dielectric layer 170 as measured at a horizontal portion can be from 2 nm to 200 nm, although lesser and greater thicknesses can also be employed.

As in the first embodiment, the first dielectric material can be silicon oxide, silicon nitride, or a dielectric metal oxide having a dielectric constant greater than 8.0. Non-limiting examples of dielectric metal oxides having a dielectric constant greater than 8.0 include $HfO_2$, $ZrO_2$, $Ta_2O_5$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof, in which each value of x is independently from 0.5 to 3 and each value of y is independently from 0 to 2.

Figure 10:
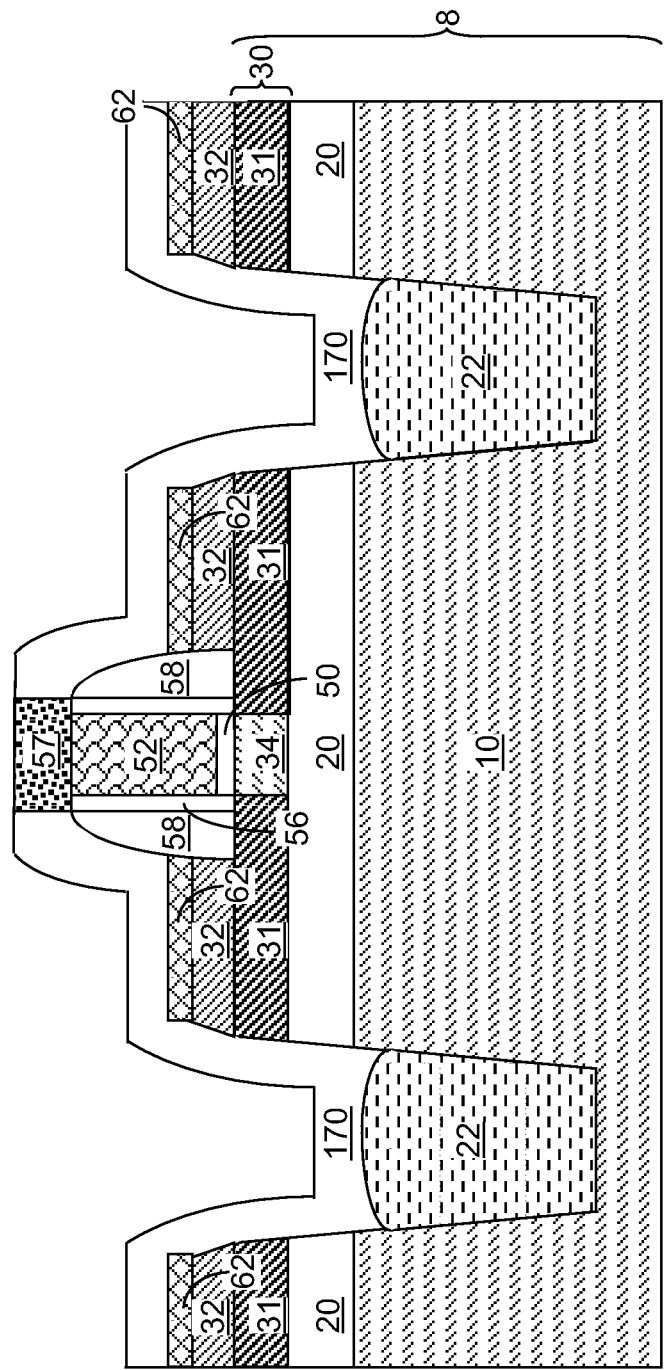
FIG. 10 is a vertical cross-sectional view of the second exemplary semiconductor structure according to the second embodiment of the present disclosure after optional planarization of the first dielectric layer.

Referring to FIG. 10, a top portion of the first dielectric layer 170 may be optionally planarized employing a patterned structure on the semiconductor device as a stopping layer. For example, the portion of the first dielectric layer 170 above the top surface of the gate cap dielectric 57 can be removed by chemical mechanical planarization employing the gate cap dielectric 57 as a stopping layer.

Figure 11:
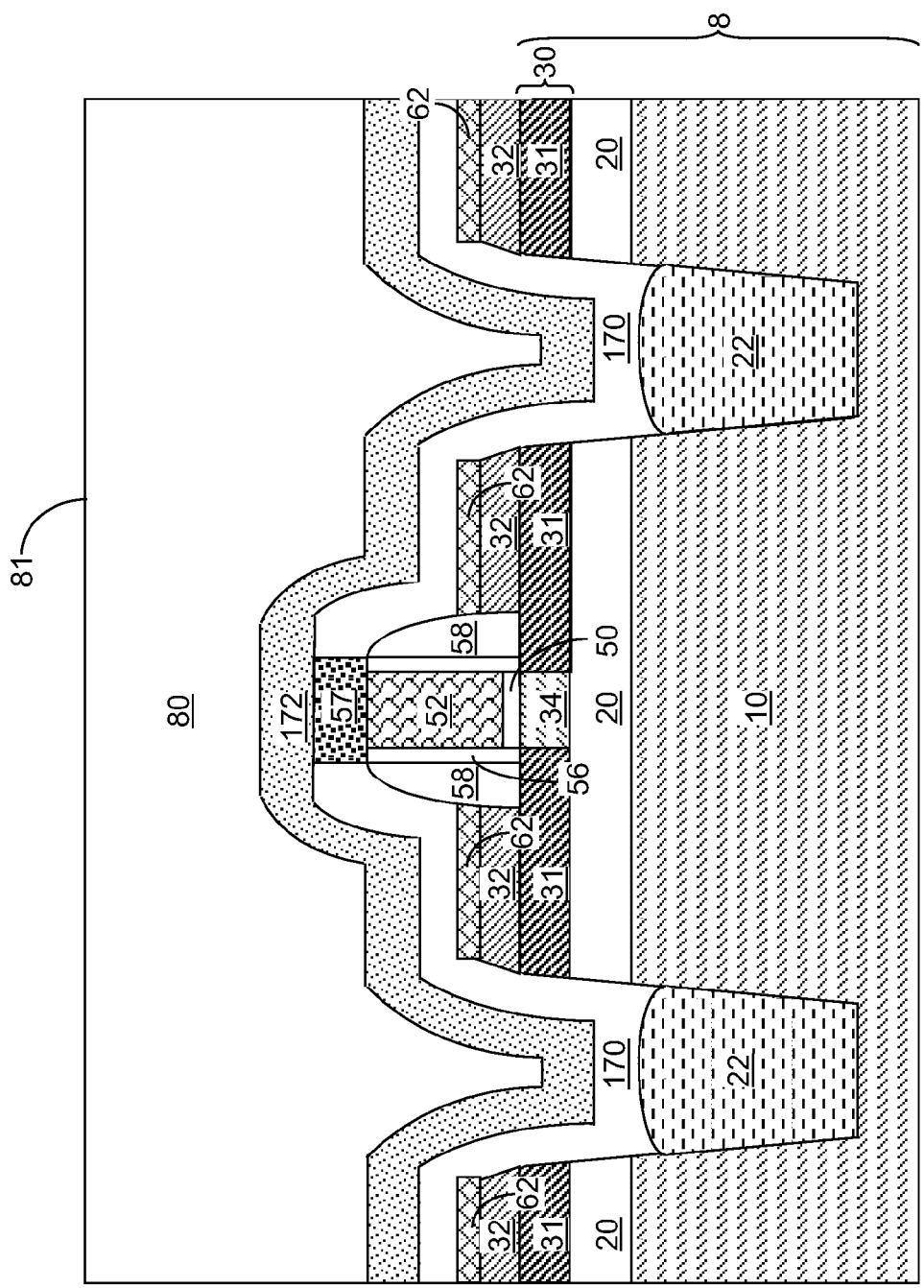
FIG. 11 is a vertical cross-sectional view of the second exemplary semiconductor structure according to the second embodiment of the present disclosure after formation of the second dielectric layer and a contact-level dielectric layer.

Referring to FIG. 11, a second dielectric layer 172 is deposited above the semiconductor device and the first dielectric layer 170. The second dielectric layer 172 is a contiguous dielectric layer that contacts all top surfaces of the first dielectric layer 170 and other exposed surfaces of the semiconductor device such as a field effect transistor.

The second dielectric layer 172 includes a second dielectric material, which is different from the first dielectric material so that the second dielectric material can be subsequently removed with high selectivity to the first dielectric material.

For example, if the first dielectric material of the first dielectric layer 170 includes silicon nitride, and the second dielectric material of the second dielectric layer 172 can be silicon oxide or a dielectric metal oxide having a dielectric constant greater than 8.0. Alternately, if the first dielectric material includes silicon oxide, the second dielectric material can be silicon nitride or a dielectric metal oxide having a dielectric constant greater than 8.0. Yet alternately, if the first dielectric material is a first species of dielectric metal oxides having a dielectric constant greater than 8.0, and the first dielectric material can be silicon oxide, silicon nitride, or a second species of dielectric metal oxides having a dielectric constant greater than 8.0 that can be removed selective to the first species of dielectric metal oxides.

In one embodiment, the second dielectric layer 172 can include a stress-generating silicon nitride material. The stress-generating silicon nitride material can be a tensile-stress-generating silicon nitride material, or can be a compressive-stress-generating silicon nitride material.

The second dielectric layer 172 can be deposited, for example, by chemical vapor deposition (CVD). The thickness of the second dielectric layer 172 as measured at a horizontal portion can be from 20 nm to 200 nm, although lesser and greater thicknesses can also be employed. As a contiguous dielectric layer, the second dielectric layer 172 contiguously extends over the entirety of the semiconductor device and the entirety of the first dielectric layer 170.

A contact-level dielectric layer 80 is deposited and planarized over the second dielectric layer 172. The contact-level dielectric layer 80 includes a dielectric material such as organosilicate glass, undoped silicate glass, doped silicate glass, or silicon nitride. In one embodiment, the contact-level dielectric layer 80 includes a dielectric material that is different from the second dielectric material.

The contact-level dielectric layer 80 can be deposited, for example, by chemical vapor deposition (CVD) or spin-coating. The contact-level dielectric layer 80 is deposited so that the lowest portion of the top surface of the contact-level dielectric layer 80 as deposited is located above the topmost surface of the second dielectric layer 172. The contact-level dielectric layer 80 is subsequently planarized, for example, by chemical mechanical planarization (CMP), a recess etch, or a combination thereof. The thickness of the contact-level dielectric layer 80 can be from 50 nm to 500 nm, although lesser and greater thicknesses can also be employed. The top surface 81 of the contact-level dielectric layer 80 is a planar surface that is parallel to the top surface of the top semiconductor layer 30.

The shallow trench isolation structure 22 can be located in a shallow trench laterally surrounding a bottom portion of the semiconductor device such as the planar source/drain regions 31 and the body region 34 of the field effect transistor. A portion of the second dielectric layer, which is a contiguous dielectric layer, can be located within the shallow trench and below the level of the top surface of the top semiconductor layer 30. If a top surface of the shallow trench isolation structures 22 is recessed below the top surface of the handle substrate 10, a portion of the first dielectric layer, which is a dielectric material layer, contacts the handle substrate 10.

Figure 12:
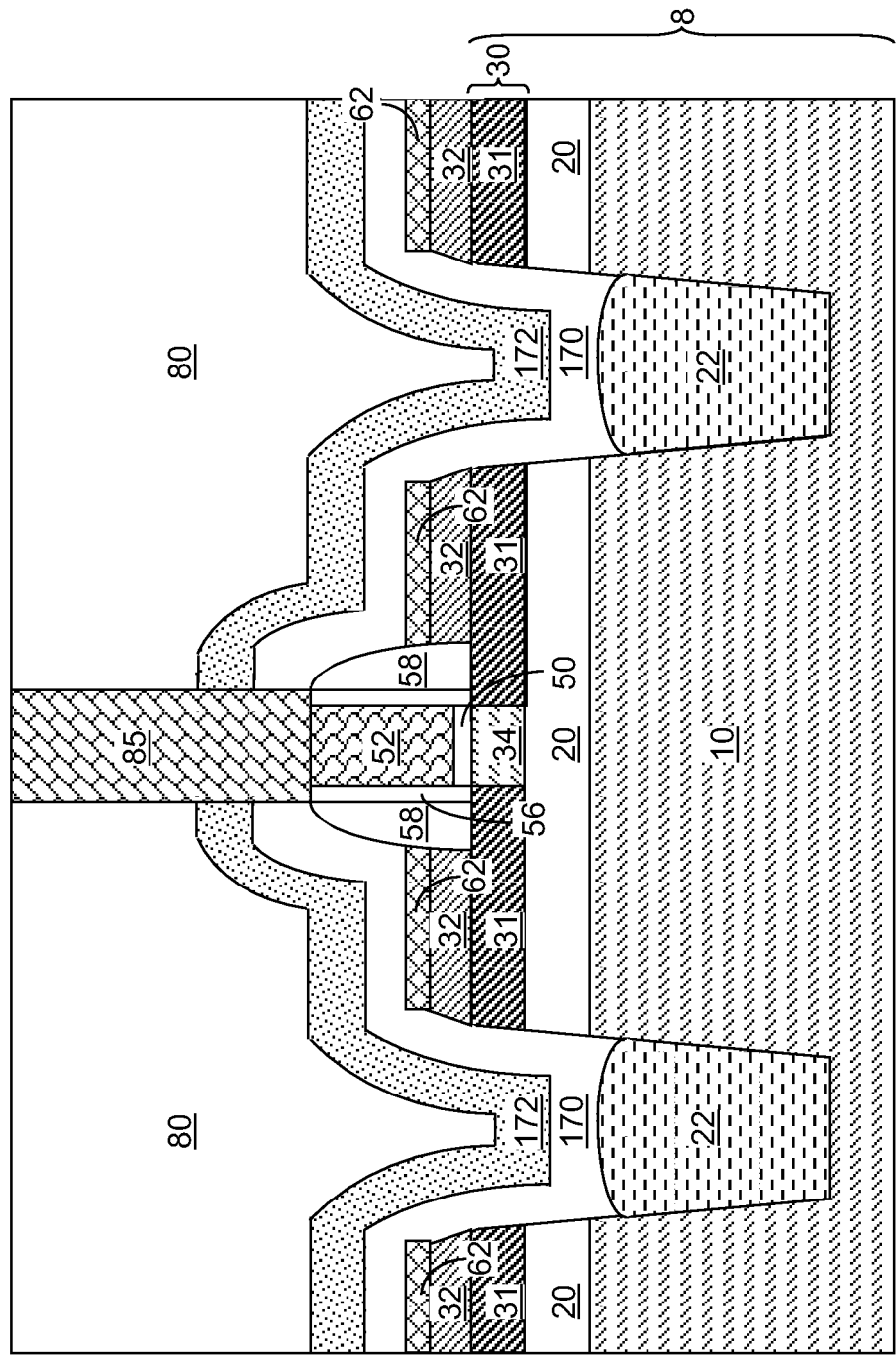
FIG. 12 is a vertical cross-sectional view of the second exemplary semiconductor structure according to the second embodiment of the present disclosure after formation of a gate contact via structure.

Referring to FIG. 12, various contact via structures can be formed directly on components of the semiconductor device. For example, a gate contact via structure 85 can be formed directly on the gate conductor 52. The gate contact via structure 85 can be formed by forming a gate contact via hole through the contact-level dielectric layer 80, the second dielectric layer 172, and the gate cap dielectric 57, filling the gate contact via hole with a conductive material, and subsequently removing excess conductive material above the top surface of the contact-level dielectric material layer 80. The gate contact via hole can be formed, for example, by employing an etch, which can be a dry etch such as a reactive ion etch.

Figure 13:
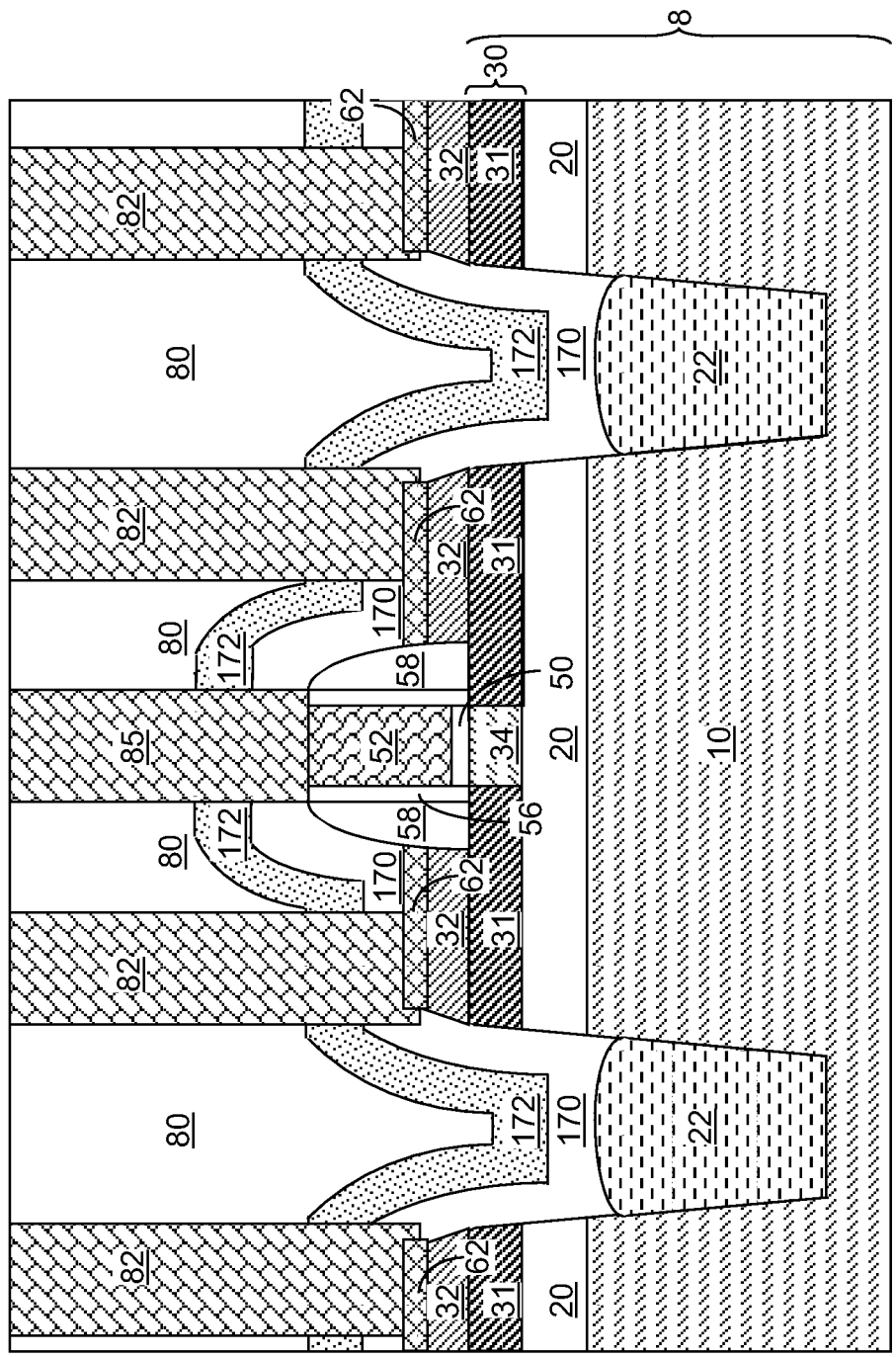
FIG. 13 is a vertical cross-sectional view of the second exemplary semiconductor structure according to the second embodiment of the present disclosure after formation of source and drain contact via structures.

Referring to FIG. 13, source and drain contact via structures 82 are formed through the contact-level dielectric material layer 80, the second dielectric layer 172, and the first dielectric layer 170. The source and drain contact via structures 82 can be formed directly on components of the field effect transistor that are conductively connected to source and drain regions (31, 32) of the field effect transistor. The source and drain contact via structures 82 can be formed by forming source and drain contact via holes through the contact-level dielectric layer 80, the contiguous dielectric layer of the second dielectric layer 172, another contiguous dielectric layer of the first dielectric layer 170, filling the source and drain contact via holes with a conductive material, and subsequently removing excess conductive material above the top surface of the contact-level dielectric material layer 80. The source and drain contact via holes can be formed, for example, by employing an etch, which can be a dry etch such as a reactive ion etch.

In one embodiment, the etch process can employ an etch chemistry that removes the second dielectric material of the second dielectric layer 172 selective to the first dielectric material of the first dielectric layer 170. Thus, the source and drain contact via holes do not extend into the first dielectric layer 170 or the extent of any extension of the source and drain contact via holes into the first dielectric layer 170 is limited. Specifically, the bottommost portion of any extension of the source and drain contact via holes into the first dielectric layer 170 is located above the level of the top surface of the handle substrate 10, and preferably above the level of the top surface of the buried insulator layer 20, and more preferably above the top surface of the top semiconductor layer 30, and most preferably above a bottom surface of the source/drain metal semiconductor alloy portions 62.

In general, for any type of semiconductor device, at least one contact via structure can be formed through the contact-level dielectric layer 80, the second dielectric layer 72, and the first dielectric layer, and directly on a component of the semiconductor device located above the top surface of the top semiconductor layer 30.

If an etch that selectively removes the second dielectric material of the second dielectric layer 172 selective to the first dielectric material of the first dielectric layer 170 is employed, any extension of various contact via structures below a top surface of the component that a contact via structure vertically contacts can be limited. Thus, the bottommost portion of contact via structures can be located above the level of the top surface of the handle substrate 10, and preferably above the level of the top surface of the buried insulator layer 20, and more preferably above the top surface of the top semiconductor layer 30, thereby eliminating potential electrical shorts between a component on the top semiconductor layer 30 and any portion of the handle substrate 10.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A semiconductor structure comprising:
a semiconductor device located on a top semiconductor layer of a semiconductor-on-insulator (SOI) substrate that includes a stack, from bottom to top, of a handle substrate, a buried insulator layer, and said top semiconductor layer;
a shallow trench isolation structure having a top surface that is recessed below a top surface of said buried insulator layer;
a dielectric material layer including a first dielectric material, contacting said top surface of said shallow trench isolation structure, contacting exposed surfaces of said SOI substrate, and contacting exposed surfaces of said semiconductor device;
a contiguous dielectric layer including a second dielectric material that is different from said first dielectric material and contacting surfaces of said dielectric material layer above said shallow trench isolation structure and above said semiconductor device;
a contact-level dielectric layer located over said contiguous dielectric layer; and
at least one contact via structure extending through said contact-level dielectric layer, said contiguous dielectric layer, and said dielectric material layer, and contacting a component of said semiconductor device located above said top surface of said top semiconductor layer.

2. The semiconductor structure of claim 1, wherein said shallow trench isolation structure is located in a shallow trench laterally surrounding a bottom portion of said semiconductor device, and a portion of said contiguous dielectric layer is located within said shallow trench and below a level of said top surface of said top semiconductor layer.

3. The semiconductor structure of claim 1, wherein said semiconductor device is a field effect transistor, and said component is a source metal semiconductor alloy portion or a drain metal semiconductor alloy portion comprising a compound of a semiconductor material and a metal.

4. The semiconductor structure of claim 1, wherein said shallow trench isolation structure has a top surface that is recessed below a top surface of said handle layer.

5. The semiconductor structure of claim 4, wherein a portion of said dielectric material layer contacts said handle substrate.

6. The semiconductor structure of claim 1, wherein each of said dielectric material layer and said contiguous dielectric layer comprises silicon oxide, silicon nitride, or a dielectric metal oxide selected from the group consisting of $HfO_2$, $ZrO_2$, $Ta_2O_5$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, or an alloy thereof, in which each value of x is independently from 0.5 to 3 and each value of y is independently from 0 to 2.

7. The semiconductor structure of claim 1, wherein said contiguous dielectric layer comprises a stress-generating material.

8. The semiconductor structure of claim 1, wherein said semiconductor device comprises a vertical stack, from bottom to top, of a gate dielectric, a gate conductor, and a gate cap dielectric, wherein a top surface of said gate cap dielectric is located above said component of said semiconductor device.

9. The semiconductor structure of claim 8, wherein a topmost surface of said dielectric material layer is coplanar with said top surface of said gate cap dielectric.

* * * * *